METHOD OF MAKING JUNCTION SEMICONDUCTOR DEVICES
Filed Nov. 15, 1955
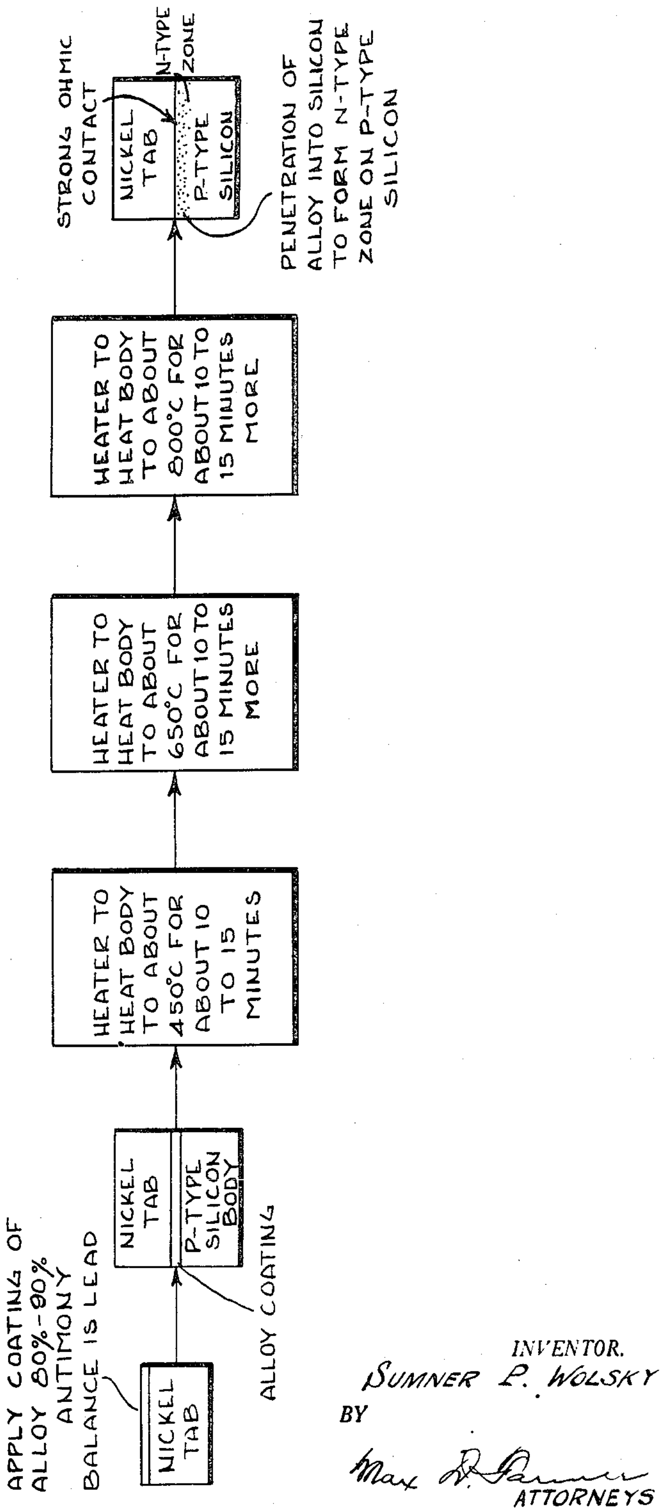
INVENTOR.
SUMNER P. WOLSKY
BY
Max [signature]
ATTORNEYS

United States Patent Office 2,937,961

Patented May 24, 1960

2,937,961

METHOD OF MAKING JUNCTION SEMI-CONDUCTOR DEVICES

Sumner P. Wolsky, Lexington, Mass., assignor, by mesne assignments, to the United States of America as represented by the Secretary of the Navy Filed Nov. 15, 1955, Ser. No. 547,053

1 Claim. (Cl. 148—1.5)

This invention relates to semiconductor signal translating devices and more particularly to materials for providing junction semiconductor devices comprising adjacent zones of opposite type conductivity.

Devices of the junction type generally comprise a body of semiconductive material such as are germanium or silicon which have alterating zones of p and n-type conductivities. For example, a transistor may consist of two zones of n-type semiconductive material with a p-type zone therebetween or of two zones of p-type material with an n-type zone therebetween. Semiconductor diodes may consist of a semiconductive material consisting of p-type zone, adjacent to an n-type zone. In the junction transistor or diode, an electrode makes ohmic contact with each of the zones.

As is well known, n-type semiconductive material refers to a class wherein the majority of the carriers are electrons and is associated with donor type impurities such as the pentavalent elements, arsenic and antimony. On the other hand, in p-type semiconductive material, the majority carrier consists of holes and this type material is characteristically associated with acceptor type materials such as the trivalent elements boron, aluminum and indium.

It is known that semiconductor junction devices having silicon as the semiconductive body material are desirable in preference to the commonly used germanium due to their ability to operate at higher temperatures. However, the formation of n–p junctions in silicon is extremely difficult and the making of a low resistance strong ohmic contact between the silicon and an electrode in general presents a formidable problem. The latter may be due to the difficultly wettable silicon surface by the electrode metal or solder because of the presence of a tenacious oxide film on the surface of the silicon.

It is, accordingly, the primary object of the present invention to provide a method of making a silicon semiconductive body having a p–n junction therein and a strong ohmic contact between an electrode and the n-zone of said junction.

It is a further object to provide a method of making a p–n junction in a p-type silicon semiconductive body wherein the characteristic impurity imparting n-type conductivity characteristics to the n-zone is a lead-antimony alloy, and of making a strong ohmic contact between the n-zone and an electrode.

In accordance with the present invention, there is provided a method of making a silicon semiconductor element comprising adjacent zones of p and n-type conductivities and a strong ohmic contact between an electrode and the n-type zone comprising coating an electrically conductive tab with a lead-antimony alloy and placing the coated tab in intimate contact with the surface of a p-type silicon body. The lead-antimony alloy is fused onto the silicon whereby the alloy penetrates into the silicon to provide an n-type zone adjacent the p-type zone in the silicon body and a strong ohmic contact is formed between the conductive tab and the n-type zone.

Other objects and many of the attendant advantages of this invention will be readily appreciated as the same becomes better understood by reference to the following detailed description.

The invention is graphically outlined in the flow sheet presented in the enclosed drawing.

Since antimony in common with arsenic, bismuth and other pentavalent elements imparts n-type conductivity characteristics to a semiconductor body when incorporated as a significant impurity therein, n-type silicon should be formed on the addition of antimony thereto. However, the incorporation of antimony directly into silicon is a difficult procedure.

With the present invention, the lead-antimony alloy provides a material which, in the molten state, readily wets the underlying silicon surface and permits the diffusion of the antimony into the silicon to form an n-type zone. If the alloy is present as a coating on an electrically conductive element such as a nickel or other conductive metal tab, when the coated tab is fused on to the surface of the silicon body, in addition to diffusion of the antimony into the silicon to form the n-type zone, a strong ohmic contact is formed between the n-type zone and the metal tab.

To carry out the present invention, a block of p-type silicon, that is silicon of an extremely high purity utilizable for semiconductor signal translating devices (at least 99% pure), and having a small amount of an acceptor type significant impurity therein (such as boron, aluminum, indium, etc.) is utilized as the beginning material. Such p-type silicon is well known in the semiconductor art and details of its fabrication are believed to be unnecessary. An electrically conductive element, such as a metal tab, preferably nickel is coated with a lead-antimony alloy by any well-known coating method. Although the percentages of the antimony and lead in the alloy coating are not critical, it is preferred that the antimony be present in a range of concentration of 80 to 90%, with the remainder lead, 80% and 90% concentrations of antimony being examples within this range. The coated nickel tab is placed in intimate contact with the surface of the p-type silicon block by use of a convenient jig or other suitable well known means in the semiconductor art to effectively form a compact of the alloy coated tab and the p-type silicon body. This compact is now heated, preferably in an inert atmosphere, to fuse the tab onto the p-type silicon. The inert atmosphere may consist of one of the noble gases, nitrogen, and hydrogen or mixtures thereof, a suitable atmosphere consisting essentially of about 95% nitrogen and 5% hydrogen. The heating temperature should be high enough to wet the silicon with the lead-antimony alloy. It has been found that a temperature range of about 450° to 800° C. is a good range of fusing temperature. To insure that the lead-antimony alloy wets the silicon surface well, the fusion may be carried out by utilizing a definite temperature cycle which consists of heating the compact at approximately 450° C. for about 10 to 15 minutes, then at 650° C. for about 10 to 15 minutes and finally at about 800° C. for about 10 to 15 minutes. It has been found that the use of these prescribed cycles leads to a good wetting of the silicon. During the heating, the antimony penetrates a short distance into the silicon forming an n-type zone contiguous with the p-type zone and the nickel tab is fused to the n-type zone so that there results a p–n junction silicon device with a strong ohmic contact between the nickel which will serve as an electrode and the n-type zone. If p–n device is so formed, there is provided a fused junction silicon diode. In the event that an n–p–n silicon junction transistor is desired, it is merely necessary to carry through the method of the present invention with a lead-antimony coated nickel tab being fused on to opposite surfaces of a p-type silicon block.

Obviously many modifications and variations of the present invention are possible in the light of the above teachings. It is therefore to be understood that within the scope of the appended claim the invention may be practiced otherwise than as specifically described.

I claim:

A method of making a silicon semiconductor element comprising adjacent zones of p and n-type conductivities and a strong ohmic contact between an electrode and the n-type zone comprising coating a nickel tab with an alloy consisting essentially of about 80% to 90% antimony and the remainder lead, making a compact of the alloy coated nickel tab and a p-type silicon body, successively heating the compact in an inert atmosphere, at a temperature of about 450° C. for about 10 to 15 minutes, at a temperature of about 650° C. for about 10 to 15 minutes, and at a temperature of about 800° C. for about 10 to 15 minutes whereby the alloy penetrates into the silicon to form an n-type zone contiguous with a p-type zone in said silicon body and a strong ohmic contact is formed between said n-type zone and said metal tab.

References Cited in the file of this patent

UNITED STATES PATENTS

| | | |
|---|---|---|
| 2,644,852 | Dunlap | July 7, 1952 |
| 2,697,269 | Fuller | Dec. 21, 1954 |
| 2,721,965 | Hall | Oct. 25, 1955 |